United States Patent [19]

Iwatare

[11] Patent Number: 5,782,546
[45] Date of Patent: Jul. 21, 1998

[54] DOOR STRUCTURE FOR CABINETS

[75] Inventor: Misao Iwatare, Tokyo, Japan

[73] Assignee: NEC Corporation, Tokyo, Japan

[21] Appl. No.: 835,499

[22] Filed: Apr. 8, 1997

[30] Foreign Application Priority Data

Apr. 10, 1996 [JP] Japan .................. 8-086966

[51] Int. Cl.⁶ .................. H05K 7/20; H05K 9/00
[52] U.S. Cl. .................. 312/236; 361/692; 361/818; 52/455
[58] Field of Search .................. 312/236, 213; 361/692, 818, 816; 211/41.17, 26.2; 52/455; 174/35 GC

[56] References Cited

U.S. PATENT DOCUMENTS

| | | | |
|---|---|---|---|
| 460,323 | 9/1891 | Merriman | 52/455 |
| 1,427,282 | 8/1922 | Grevais | 52/455 |
| 4,156,794 | 5/1979 | Robinson | 361/692 X |
| 4,327,398 | 4/1982 | Christison | 361/692 X |
| 4,931,326 | 6/1990 | Weil | 174/35 GC |
| 5,134,547 | 7/1992 | Takamizawa | 361/818 |
| 5,160,806 | 11/1992 | Harada et al. | 174/35 GC |
| 5,544,012 | 8/1996 | Koike | 312/236 X |
| 5,548,083 | 8/1996 | Yamamoto | 174/35 GC |

FOREIGN PATENT DOCUMENTS

| | | | |
|---|---|---|---|
| 0 397 616 AI | 11/1990 | European Pat. Off. | |
| 401297893 | 11/1989 | Japan | 361/816 |
| 403110893 | 5/1991 | Japan | 361/692 |
| 405055781 | 3/1993 | Japan | 361/818 |
| 406275978 | 9/1994 | Japan | 174/35 GC |
| 2 297 196 | 7/1996 | United Kingdom | |

*Primary Examiner*—Peter R. Brown
*Assistant Examiner*—David E. Allred
*Attorney, Agent, or Firm*—Scully, Scott, Murphy & Presser

[57] ABSTRACT

A door structure for cabinets according to the invention is configured in a double structure wherein a front door 1 of a cabinet 5 comprises a main surface part 1A, which constitutes the external face, and a metallic meshed member 4, which constitutes the internal face. In the main surface part 1A and the top, bottom, right and left side members 1B through 1E of the door are bored pluralities of ventilation holes 2 and 3, respectively, so that air, entering through lower holes and warmed inside, is discharged through upper holes by such actions as conduction and stirring within the cabinet 5. This structure can enhance both the electromagnetic shielding performance and the cooling effect.

6 Claims, 3 Drawing Sheets

DOOR STRUCTURE FOR CABINETS

BACKGROUND OF THE INVENTION

The present invention relates to a door structure for cabinets, and more particularly to a front door structure for cabinets to house electronic equipment, such as communication apparatuses.

A conventional cabinet for housing electronic communication equipment has electromagnetic shield packing between itself and its door to prevent electric noise generated by the communication equipment it houses from leaking outside or to electronically protect the communication equipment within from electronic noise of any external origin.

This electromagnetic shield packing consists either of metallic powder containing rubber or cylindrically shaped rubber packing around which a metallic mesh is wound. As a result, the gap between the cabinet body and the door is very closely sealed to allow virtually no ventilation.

On the other hand, the communication equipment itself tends to increase in power consumption to transfer signals at ever higher speed, necessitating more effective cooling. Since, however, the sealing between the cabinet and its door is made very tight to let in no external air, there is the disadvantage that electronic equipment, such as communication apparatuses, housed in the cabinet cannot be cooled as much as desired.

SUMMARY OF THE INVENTION

An object of the present invention is to obviate the aforementioned disadvantage, and to provide a door structure for cabinets intended to enable electronic equipment housed in the cabinet to be efficiently cooled and to operate normally without adversely affecting the electromagnetic shield effect.

Another object of the invention is to provide a door structure for cabinets to let external cool air to come into the cabinet sufficiently and to adequately cool the equipment within.

According to the invention, there is provided a door structure for cabinets to be used on the front of a cabinet for housing electronic equipment, provided with a front door member arranged in parallel to the front face of the cabinet and having a plurality of holes. Inside this front door member is provided a meshed member built of an electroconductive material.

The door structure for cabinets according to the invention may have a door body comprising a main surface part parallel to the front face of the cabinet and the top, bottom, right and left sides of the main surface part. Each of these main, top, bottom, right and left sides has a plurality of holes. Inside the door body is provided a meshed member built of an electroconductive material.

The door body, meshed member and cabinet are all connected to one another electrically and have the same potential. The same structure can also be used as rear door of the cabinet. Louvers may as well be provided in place of the pluralities of holes.

According to the invention, the door is configured in a double structure comprising a door body and a metallic meshed member for electromagnetic shielding. The door body has pluralities of ventilation holes, through which the natural convection ensuing from the temperature rise of the electronic equipment housed in the cabinet is let flow through these ventilation holes to enhance the cooling effect.

BRIEF DESCRIPTION OF THE DRAWINGS

The above-mentioned and other objects, features and advantages of the present invention will become more apparent from the following detailed description when taken in conjunction with the accompanying drawings, wherein.

Figure 1:
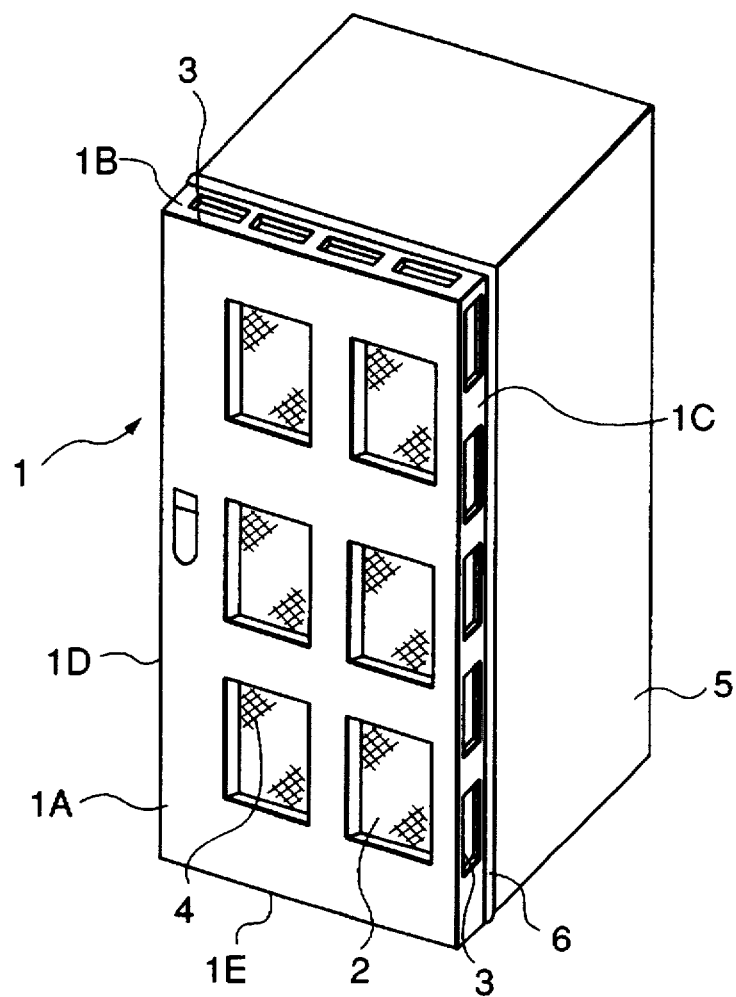
FIG. 1 shows an external perspective view of a preferred embodiment of the invention.

In the drawings, identical reference signs denote identical structural elements.

DETAILED DESCRIPTION OF THE PREFERRED EMBODIMENTS

FIG. 1 shows an external perspective view of a preferred embodiment of the present invention. Referring to FIG. 1, a cabinet 5 is a shielding structure, housing communication equipment 7 (see FIG. 3), within. The front side of this cabinet 5 is provided with a door 1 which (though not shown) is hinged or otherwise fitted rotatably by a known structure to the cabinet 5 so that the cabinet 5 can be thereby opened or closed as desired.

Between the cabinet 5 and the door 1 is provided electromagnetic shield packing 6 to improve the electromagnetic shielding performance of the cabinet 5.

Figure 2:
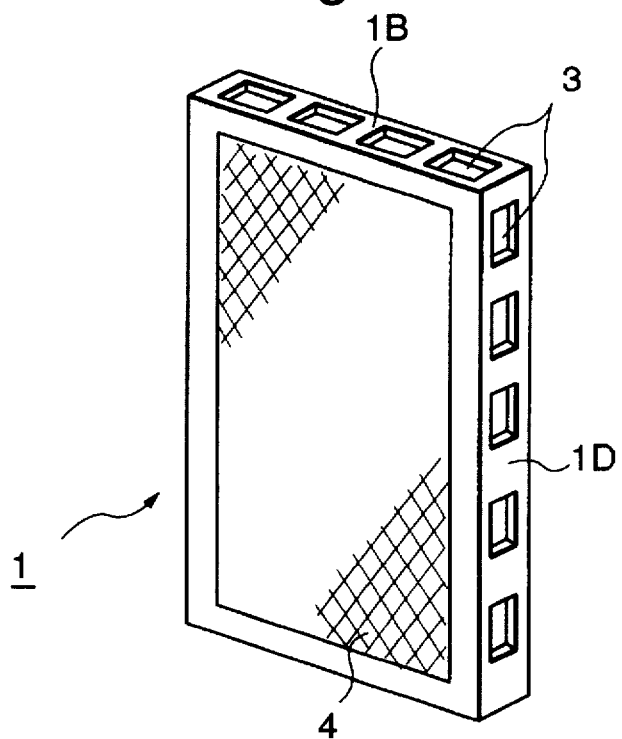
FIG. 2 shows a perspective view of the back side of the door, which is a preferred embodiment of the invention.

This door 1, as illustrated in the external perspective view of FIG. 1 and the perspective view of the back side of the door 1 of FIG. 2, is a double structure, which consists of a main surface part 1A provided in parallel to the front side of the cabinet and constituting the external face and an electroconductive metallic mesh (meshed member) 4 provided in parallel to and at a certain distance from the external face and constituting the internal face.

At the top and bottom and on both sides of the main surface part 1A, which constitutes the external face, are arranged side members 1B through 1E of a certain width, and the width of these side members 1B through 1E provides a certain space between the main surface part 1A, which constitutes the external face, and the metallic mesh 4, which constitutes the internal face.

In these main surface part 1A and top, bottom, right and left side members 1B through 1E are bored pluralities of holes 2 and 3, respectively, to serve as ventilation ports.

Figure 3:
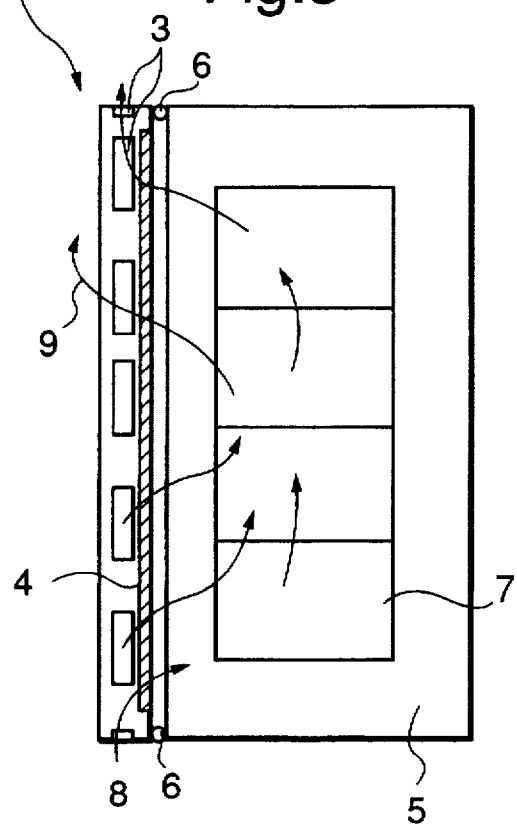
FIG. 3 shows a vertical cross-sectional view of the structure of FIG. 1.

FIG. 3 shows a vertical cross-sectional view of the structure of FIG. 1. Out of the holes in the main surface part 1A, which constitutes the external face of the door 1 (see FIG. 1), and the top, bottom, right and left side members 1B through 1E, lower ones serve as inlets for external air 8, which enters as cool air into the cabinet 5 through the metallic mesh 4 constituting the internal face. By being warmed by the heat of the communication equipment 7 housed in the cabinet 5, the air that has entered is gathered in the upper part by such actions as conduction and stirring.

The warm air that has gathered in the upper part passes through the upper area of the metallic mesh 4 and is discharged as warm air 9 through the holes in the upper area of the main surface part 1A of the door 1 and the top, bottom, right and left sides 1B through 1E. In this manner, the natural convection of air in the cabinet 5 enables the communication equipment 7 to be cooled.

The main surface part 1 of the door 1 and the top, bottom, right and left sides 1B through 1E may be built of stainless steel, for instance. The metallic mesh 4 is also built of stainless steel, dimensioned and shaped to minimize the connection resistance with due consideration for electric noise and the like with a view to ensuring a satisfactory electromagnetic shielding effect.

The shielding cabinet body 5 and the door 1 are electrically connected by the electromagnetic shield packing 6, and the door 1 and the metallic mesh 4 are also electrically connected to each other. This connecting arrangement places the cabinet 5, the door 1, the metallic mesh 4 and the electromagnetic shield packing 6 all at the same potential, so that, by grounding the cabinet 5 (reference potential) for example, the electromagnetic shielding of the internal communication equipment 7 is perfected.

Figure 4:
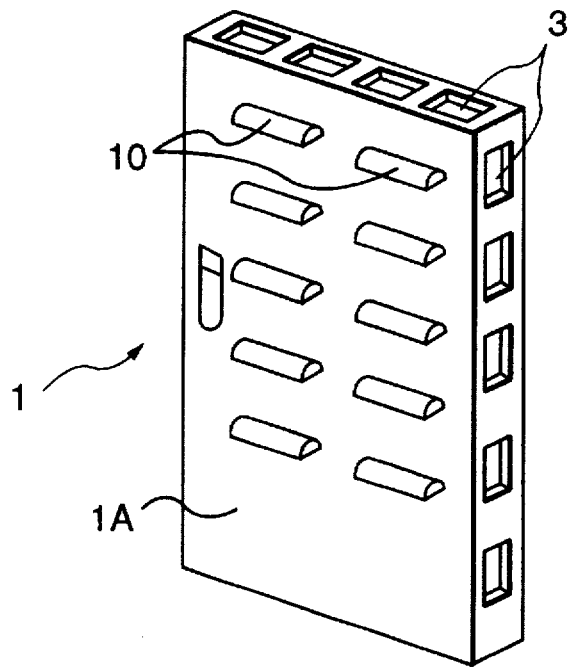
FIG. 4 shows a perspective view of another preferred embodiment of the invention.

FIG. 4 shows a perspective view of the door 1 of another preferred embodiment of the present invention, wherein the holes 2 in the main surface part 1A, which constitutes the external face, shown in FIG. 1 may be replaced with louvers 10.

Figure 5:
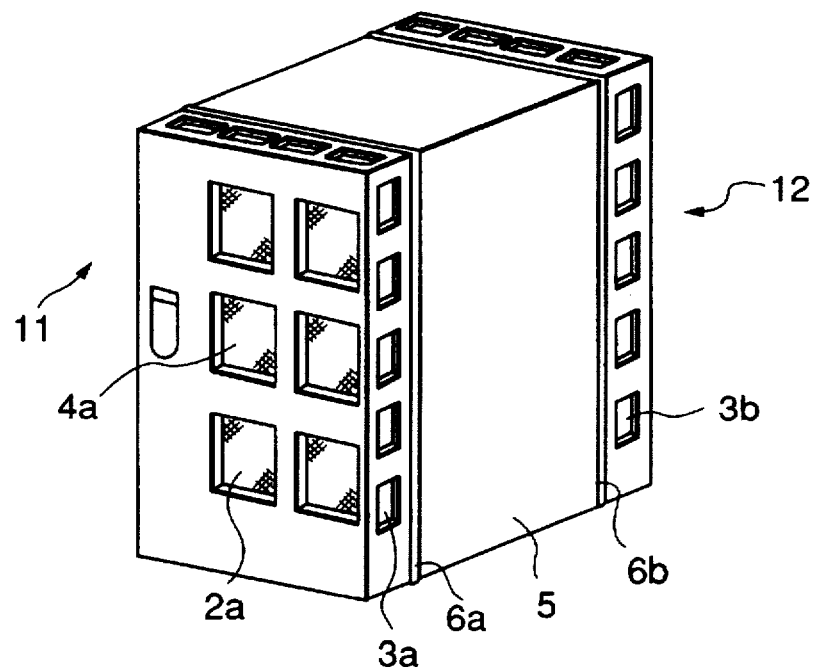
FIG 5 shows a perspective view of still another preferred embodiment of the invention.

FIG. 5 shows a perspective view of still another preferred embodiment of the invention, wherein not only the front door 11 but also the back door 12 of the cabinet 5 has the same structure as what is illustrated in FIGS. 1 through 4 to further enhance the cooling effect.

As hitherto described, according to the present invention, ventilation holes are provided in the main surface part of the front side and in the top, bottom, right and left sides of the door, and a shielding metallic mesh is arranged within, resulting in a substantial increase in the opening ratio of the ventilation holes for more efficient ventilation and cooling, and ensuring adequate shielding performance as well as sufficient strength.

What is claimed is:

1. A door structure for a cabinet having an external face and an internal face parallel to each other and interconnected by flat top, bottom, left, and right sides each perpendicular to the faces, a plurality of holes in the external face and a plurality of bored holes in each of the sides at locations between the external and internal faces permitting free passage of air through the external face and each of the sides, said internal face comprising a meshed member of electroconductive material permitting free passage of air therethrough.

2. A door structure for a cabinet, as claimed in any of claims 3 or 4, to be sued also as rear door of said cabinet.

3. A door structure for a cabinet, as claimed in claim 1, further including an electromagnetic shield packing provided between the body of said cabinet and said door body. cabinet.

4. A door structure for a cabinet, as claimed in claim 1, wherein each of the external face, internal face, and sides is electrically connected to each other and adapted to be electrically connected to the cabinet to provide the same electrical potential throughout the cabinet and door structure.

5. A door structure for a cabinet, as claimed in claim 1, wherein louvers are provided in place of said holes.

6. A door structure for a cabinet, as claimed in claim 1, wherein said door is rotatably supported by the body of said cabinet around an axis to open or close said cabinet.

* * * * *

UNITED STATES PATENT AND TRADEMARK OFFICE
CERTIFICATE OF CORRECTION

PATENT NO. : 5,782,546
DATED : July 21, 1998
INVENTOR(S) : Misao Iwatare

It is certified that error appears in the above-identified patent and that said Letters Patent is hereby corrected as shown below:

Column 4, Line 17, Claim 2: "sued" should read --used--

Column 4, Line 21, Claim 3: "body.cabinet." should read --body.--

Signed and Sealed this

Seventeenth Day of October, 2000

Attest:

Q. TODD DICKINSON

Attesting Officer         *Director of Patents and Trademarks*